US008018253B2

(12) United States Patent
Schreiber et al.

(10) Patent No.: US 8,018,253 B2
(45) Date of Patent: Sep. 13, 2011

(54) SENSE AMPLIFIER CIRCUIT AND RELATED CONFIGURATION AND OPERATION METHODS

(75) Inventors: Russell Schreiber, Austin, TX (US); Keith Kasprak, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 41 days.

(21) Appl. No.: 12/549,961

(22) Filed: Aug. 28, 2009

(65) Prior Publication Data

US 2011/0050284 A1     Mar. 3, 2011

(51) Int. Cl.
*G01R 19/00*   (2006.01)
*G11C 7/00*   (2006.01)
*H03F 3/45*   (2006.01)

(52) U.S. Cl. ........... 327/55; 327/51; 327/52; 327/53; 327/54; 327/56

(58) Field of Classification Search .......... 327/52, 327/54, 55
See application file for complete search history.

(56) References Cited

U.S. PATENT DOCUMENTS 7,053,668 B2 *   5/2006   Nakazato et al. .............. 327/55

* cited by examiner

*Primary Examiner* — Lincoln Donovan
*Assistant Examiner* — John W Poos
(74) *Attorney, Agent, or Firm* — Ingrassia Fisher & Lorenz, P.C.

(57) ABSTRACT

A sense amplifier circuit is provided with a first transistor arrangement comprising a first n-type field effect transistor (NFET) having a respective body node, and a second transistor arrangement comprising a second NFET having a respective body node. The second transistor arrangement is electrically coupled to the first transistor arrangement, and the body node of the first NFET is electrically coupled to the body node of the second NFET. The sense amplifier circuit also includes or cooperates with a voltage condition selector that is electrically coupled to the body node of the first NFET and to the body node of the second NFET. The voltage condition selector is configured to assert one of a plurality of voltage conditions at the body node of the first NFET and at the body node of the second NFET.

24 Claims, 2 Drawing Sheets

US 8,018,253 B2

SENSE AMPLIFIER CIRCUIT AND RELATED CONFIGURATION AND OPERATION METHODS

TECHNICAL FIELD

Embodiments of the subject matter described herein relate generally to electronic circuits and devices. More particularly, embodiments of the subject matter relate to a semiconductor-based sense amplifier circuit.

BACKGROUND

Transistors, such as metal oxide semiconductor field-effect transistors (MOSFETs), are the core building block of the vast majority of semiconductor devices. Semiconductor devices, such as processor devices and memory devices, can include millions of transistors. Processor devices and memory devices utilize various electronic circuits and transistor topologies to support their operation. For example, processor devices and memory devices typically employ sense amplifier circuits, which are used to detect small-swing differential voltage signals.

Traditional transistor-based sense amplifier circuits include two cross-coupled matched transistors (ideally, two matched transistors have identical electrical characteristics). For example, some conventional sense amplifier circuits include two cross-coupled n-type field effect transistors (NFETs), each in series with a p-type field effect transistor (PFET), where the body of each NFET is connected to ground and the common source node of the NFETs is connected to a pull-down transistor. Although this traditional topology performs well for certain applications, various other body voltage configurations could possibly enable the circuit to perform at higher speed and/or to achieve other performance benefits.

BRIEF SUMMARY OF EMBODIMENTS

An embodiment of an electronic circuit is provided. The electronic circuit includes: a first transistor having a first source node, a first gate node, and a first drain node; a second transistor having a second source node, a second gate node, and a second drain node; a third transistor having a third source node, a third gate node, a third drain node, and a third body node; and a fourth transistor having a fourth source node, a fourth gate node, a fourth drain node, and a fourth body node. The first gate node is electrically coupled to the third gate node, to the second drain node, and to the fourth drain node. The second gate node is electrically coupled to the fourth gate node, to the first drain node, and to the third drain node. The third source node is electrically coupled to the fourth source node. The third body node is electrically coupled to the fourth body node.

Also provided is an embodiment of a sense amplifier circuit. The sense amplifier circuit includes a first transistor arrangement comprising a first n-type field effect transistor (NFET) having a respective body node, and a second transistor arrangement comprising a second NFET having a respective body node. The second transistor arrangement is electrically coupled to the first transistor arrangement, and the body node of the first NFET is electrically coupled to the body node of the second NFET. The sense amplifier circuit also includes a voltage condition selector electrically coupled to the body node of the first NFET and to the body node of the second NFET. The voltage condition selector is configured to assert one of a plurality of voltage conditions at the body node of the first NFET and at the body node of the second NFET.

A method of configuring and operating a sense amplifier circuit is also provided. The method provides the sense amplifier circuit with a first PFET, a first NFET electrically coupled to the first PFET, a second PFET, and a second NFET coupled to the second PFET. The first NFET has a first body node, the second NFET has a second body node, and the first body node is electrically coupled to the second body node. The method asserts a plurality of different voltage conditions at the first body node and at the second body node, and operates the sense amplifier circuit under each of the different voltage conditions to obtain test results corresponding to each of the different voltage conditions. The method continues by selecting one of the different voltage conditions to obtain a selected voltage condition, wherein the selected voltage condition is influenced by the test results. The method then configures a voltage condition selector of the sense amplifier circuit for assertion of the selected voltage condition at the first body node and at the second body node.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
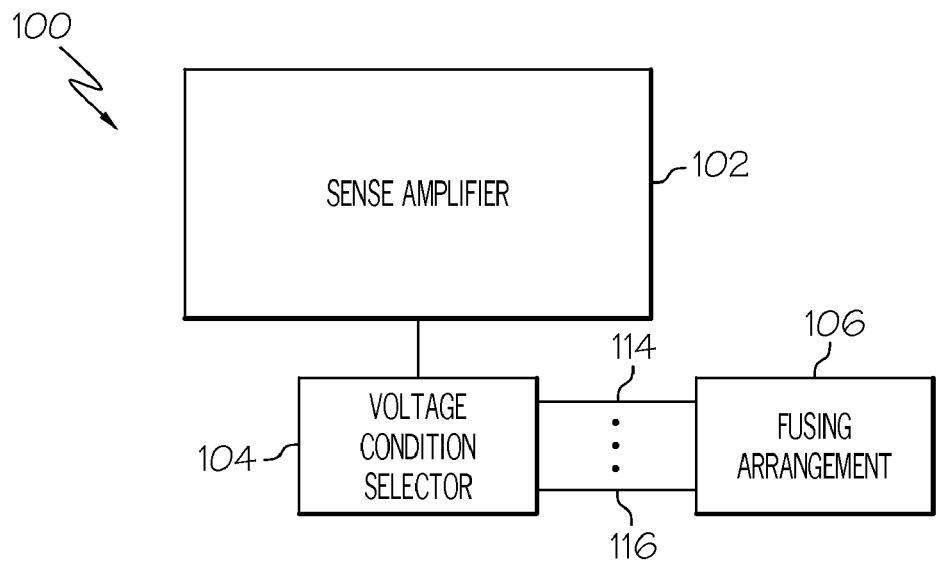
FIG. 1 is a schematic representation of an embodiment of a sense amplifier system.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The following description refers to elements or nodes or features being "connected" or "coupled" together. As used herein, unless expressly stated otherwise, "coupled" means that one element/node/feature is directly or indirectly joined to (or directly or indirectly communicates with) another element/node/feature, and not necessarily mechanically. Likewise, unless expressly stated otherwise, "connected" means that one element/node/feature is directly joined to (or directly communicates with) another element/node/feature, and not necessarily mechanically.

A sense amplifier circuit is typically used to sense the state of a small-swing differential voltage signal. Sense amplifier circuits are often used in memory devices such as static random access memory (SRAM) arrays. Sense amplifier circuits are also used in microprocessor chips that employ SRAM modules or macros. Ideally, the two cross-coupled output transistors (NFETs) of a sense amplifier circuit are well-matched, i.e., their electrical characteristics are identical. In accordance with conventional designs, the body nodes or terminals of the cross-coupled NFETs are each individually tied to ground (zero volts). In accordance with other conventional designs, the body nodes or terminals of the cross-coupled NFETs are each individually left floating. Grounding or floating the body nodes in this manner may not result in consistently optimized or improved performance across different wafers, lots, or devices.

An embodiment of a sense amplifier circuit described here includes a direct electrical connection between the two body nodes of the cross-coupled NFETs. The voltage condition at this common body node can be dynamically set to one of a plurality of different conditions for purposes of testing, evaluation, or the like. In certain embodiments, a fusing arrangement is employed to fix the desired voltage condition at the common body node during operation of the sense amplifier circuit. Thus, each chip or device that includes the sense amplifier circuit can be tested and configured for optimized performance in a chip-by-chip, wafer-by-wafer, or lot-by-lot manner.

FIG. 1 is a schematic representation of an embodiment of a sense amplifier system 100, which may be implemented in a microprocessor system, a microprocessor chip, an SRAM module or cell, or in any system, device, or circuit that senses or detects a small-swing differential voltage signal. In certain embodiments, the sense amplifier system 100 is incorporated into an SRAM module of a microprocessor device. The sense amplifier system 100 generally includes, without limitation: a sense amplifier circuit 102; a voltage condition selector 104 coupled to the sense amplifier circuit 102; and a fusing arrangement 106 coupled to the voltage condition selector 104.

The sense amplifier circuit 102 is a transistor-based circuit that is designed to sense/detect the state of a small-swing differential input. Although not depicted in FIG. 1, an embodiment of the sense amplifier circuit 102 utilizes two cross-coupled NFETs, and the semiconductor body nodes of the two NFETs are electrically coupled together to form a common body node. An exemplary circuit topology for the sense amplifier circuit 102 is described below with reference to FIG. 2.

As depicted in FIG. 1, the voltage condition selector 104 is coupled to the sense amplifier circuit 102. More specifically, the voltage condition selector 104 is electrically coupled to the common body node of the NFETs used by the sense amplifier circuit 102. The voltage condition selector 104 is suitably configured to assert one of a plurality of different voltage conditions at the common body node. In certain embodiments, the voltage condition selector 104 is capable of asserting a low voltage condition, a high voltage condition, or a floating voltage condition at the common body node. These three different conditions are merely exemplary, and in practice the voltage condition selector 104 could assert more or less than three different voltage conditions. For this particular embodiment, the low voltage condition corresponds to a low reference voltage such as ground (i.e., zero volts DC), and the high voltage condition corresponds to a high reference voltage such as a supply voltage available to the sense amplifier system 100. In this regard, the high reference voltage may be the supply voltage used for the transistors of the sense amplifier circuit 102 (e.g., Vdd, which is typically within the range of about 0.6 to 1.5 volts). The floating voltage condition represents a state where the common body node is kept in an open circuit condition, i.e., no voltage is actively asserted at the common body node.

The voltage condition selector 104 may be implemented using an appropriate circuit topology such as, for example, a transistor-based topology. In certain embodiments, the voltage condition selector 104 is realized using a PFET in series with an NFET, as described in more detail below with reference to FIG. 2. In such embodiments, control/bias voltages applied to the gates of the PFET and NFET determine the voltage condition asserted by the voltage condition selector 104. In this regard, the fusing arrangement 106 is suitably configured to fix the voltages at the gate node of the PFET and at the gate node of the NFET during operation of the sense amplifier system 100. To this end, the fusing arrangement 106 may employ any suitable array or architecture that includes one or more "programmable" fuses that can be selectively burned in a way that results in the desired control voltage(s) for the voltage condition selector 104. FIG. 1 schematically depicts a first control voltage 114 and a second control voltage 116 for the voltage condition selector 104, although more than two control voltages (or, in certain embodiments, only one control voltage) may be generated by the fusing arrangement 106. As explained in more detail below with reference to FIG. 2, the first control voltage 114 and the second control voltage 116 are set by the fusing arrangement 106. For the exemplary embodiment described here, these control voltages represent gate voltages for the transistors of the voltage condition selector 104.

Figure 2:
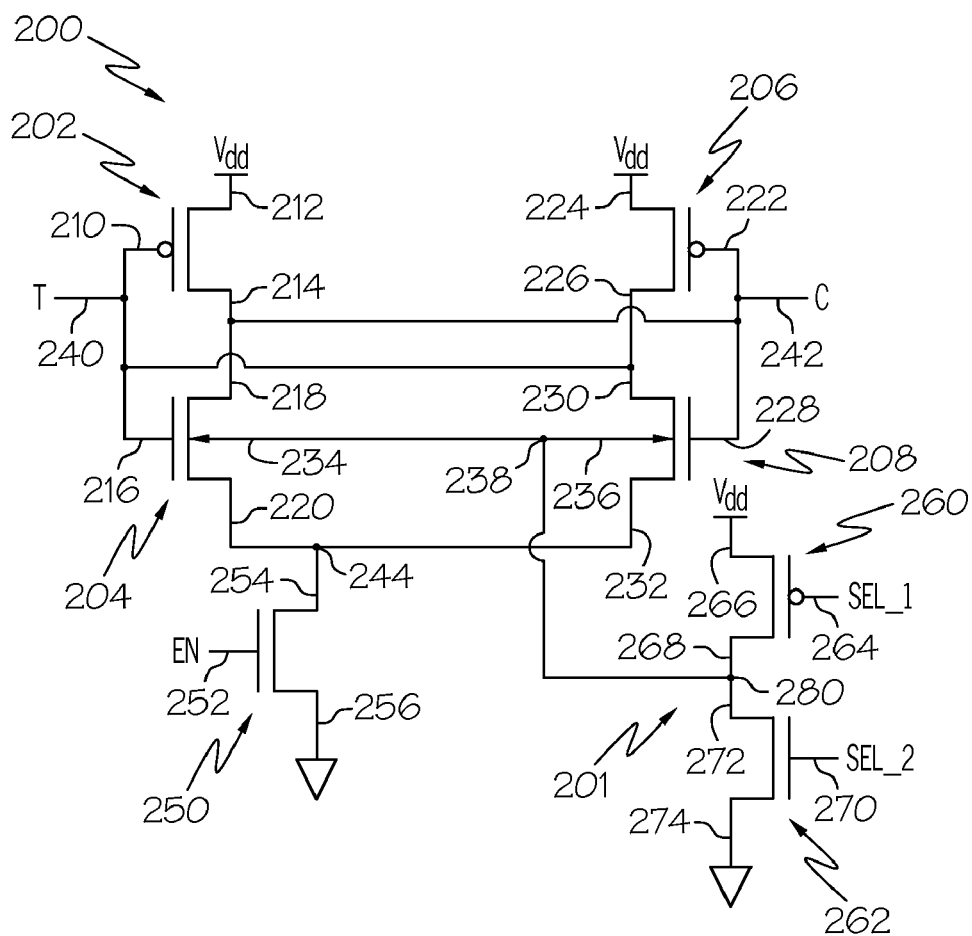
FIG. 2 is a diagram of an embodiment of a sense amplifier circuit.

FIG. 2 is a diagram of an embodiment of a sense amplifier circuit 200 and a corresponding voltage condition selector circuit 201, which are suitable for use with the sense amplifier system 100 depicted in FIG. 1. In other words, the sense amplifier circuit 102 shown in FIG. 1 could be realized using the sense amplifier circuit 200 shown in FIG. 2, and the voltage condition selector 104 shown in FIG. 1 could be realized using the voltage condition selector circuit 201 shown in FIG. 2.

For the exemplary embodiment described here, the sense amplifier circuit 200 and the voltage condition selector circuit 201 are fabricated on an appropriate semiconductor substrate. These semiconductor-based circuits can be formed using well known techniques and process steps (e.g., techniques and steps related to doping, photolithography and patterning, etching, material growth, material deposition, surface planarization, and the like) that will not be described in detail here. The semiconductor material used for the sense amplifier circuit 200 and the voltage condition selector circuit 201 is preferably a silicon material as typically used in the semiconductor industry, e.g., relatively pure silicon as well as silicon admixed with other elements such as germanium, carbon, and the like. Alternatively, the semiconductor material can be germanium, gallium arsenide, or the like. The semiconductor material can be either N-type or P-type, but is typically P-type, with wells of the appropriate type formed therein. In certain embodiments, the semiconductor material is provided on a silicon-on-insulator (SOI) substrate, which includes a support substrate, an insulator layer on the support substrate, and a layer of silicon material on the insulator layer. As explained in more detail below, an SOI implementation is one preferred approach because the bodies of the transistor devices will be insulated from one another. In other embodiments, the semiconductor material could be provided as a bulk semiconductor substrate if additional process steps are performed to isolate the bodies of the transistors as needed. For example, dual well technology could be implemented to form isolated wells for transistors in a bulk substrate.

The illustrated embodiment of the sense amplifier circuit 200 includes, without limitation: a first PFET 202; a first NFET 204; a second PFET 206; and a second NFET 208. The first PFET 202 is in series with the first NFET 204, and the second PFET 206 is in series with the second NFET 208. The first PFET 202 and the first NFET 204 in combination form a first transistor arrangement for the sense amplifier circuit 200, while the second PFET 206 and the second NFET 208 together form a second transistor arrangement for the sense amplifier circuit 200. As is clear from the topology of the sense amplifier circuit 200, the two transistor arrangements are cross-coupled to one another.

The first PFET 202 has a gate node 210, a source node 212, and a drain node 214, and the first NFET 204 has a gate node 216, a drain node 218, and a source node 220. The second PFET 206 has a gate node 222, a source node 224, and a drain node 226, and the second NFET 208 has a gate node 228, a drain node 230, and a source node 232. The first NFET 204 also has a body node 234, and the second NFET 208 also has a body node 236. Notably, the body node 234 is electrically coupled to the body node 236, forming a common body node 238 for the sense amplifier circuit 200. In certain embodiments, the body node 234 is directly connected (physically and electrically) to the body node 236. In contrast, the body node of the first PFET 202 is internally coupled to its source node 212 and, therefore, is not shown in FIG. 2. Likewise, the body node of the second PFET 206 is internally coupled to its source node 224 and, therefore, is not shown in FIG. 2.

Referring to the first PFET 202, its gate node 210 is electrically coupled to the gate node 216 of the first NFET 204, to the drain node 226 of the second PFET 206, and to the drain node 230 of the second NFET 208. In the illustrated embodiment, the gate nodes 210/216 correspond to a first input node 240 for the sense amplifier circuit 200. During operation, the first input node 240 is used for receiving a true component (labeled "T" in FIG. 2) of a differential input signal. The drain node 214 of the first PFET 202 is electrically coupled to the drain node 218 of the first NFET 204, thus placing the first PFET 202 and the first NFET 204 in series. During operation, the source node 212 of the first PFET 202 is connected to a high reference voltage, such as Vdd.

Referring to the second PFET 206, its gate node 222 is electrically coupled to the gate node 228 of the second NFET 208, to the drain node 214 of the first PFET 202, and to the drain node 218 of the first NFET 204. In the illustrated embodiment, the gate nodes 222/228 correspond to a second input node 242 for the sense amplifier circuit 200. During operation, the second input node 242 is used for receiving a complement component (labeled "C" in FIG. 2) of the differential input signal. The drain node 226 of the second PFET 206 is electrically coupled to the drain node 230 of the second NFET 208, thus placing the second PFET 206 and the second NFET 208 in series. During operation, the source node 224 of the second PFET 206 is connected to a high reference voltage, such as Vdd.

Referring to the first NFET 204, its source node 220 is electrically coupled to the source node 232 of the second NFET 208, forming a common source node 244 for the sense amplifier circuit 200. For this embodiment, the common source node 244 is electrically coupled to a pull-down or enable transistor 250 (realized as an NFET in the illustrated embodiment), which is utilized to enable a sense operation of the sense amplifier circuit 200. The enable transistor 250 has a gate node 252, a drain node 254, and a source node 256. The drain node 254 is electrically coupled to the common source node 244, and the source node 256 is electrically coupled to a low reference voltage, e.g., ground (zero volts DC). During operation of the sense amplifier circuit 200, an enable signal or voltage (labeled "EN" in FIG. 2) asserted at the gate node 252 of the enable transistor 250 is used to clock the sensing or detecting function of the sense amplifier circuit 200. Thus, when the enable signal is high, the sensing function of the sense amplifier circuit 200 is triggered. In contrast, when the enable signal is low, the sense amplifier circuit 200 does not sense the differential input signal (during this time, the sense amplifier circuit 200 can be pre-charged in preparation for the next sensing operation).

As mentioned previously, the voltage condition selector circuit 201 is electrically coupled to both the body node 234 of the first NFET 204 and the body node 236 of the second NFET 208. The illustrated embodiment of the voltage condition selector circuit 201 includes, without limitation, a PFET 260 in series with an NFET 262. The PFET 260 has a gate node 264, a source node 266, and a drain node 268, and the NFET 262 has a gate node 270, a drain node 272, and a source node 274. During operation of the sense amplifier circuit 200, the source node 266 of the PFET 260 is electrically coupled to a high reference voltage, such as Vdd, and the gate node 264 of the PFET 260 receives a first control or select voltage (labeled "SEL_1" in FIG. 2). The drain node 268 of the PFET 260 is electrically coupled to the drain node 272 of the NFET 262, forming a common drain node 280 for the voltage condition selector circuit 201. During operation of the sense amplifier circuit 200, the source node 274 of the NFET 262 is electrically coupled to a low reference voltage, such as ground (zero volts DC), and the gate node 270 of the NFET 262 receives a second control or select voltage (labeled "SEL_2" in FIG. 2).

The common drain node 280 is electrically coupled to the common body node 238 of the sense amplifier circuit 200 so that the voltage condition selector circuit 201 can assert a desired voltage condition at the body node 234 of the first NFET 204 and at the body node 236 of the second NFET 208. During operation of the voltage condition selector circuit 201, voltages (e.g., the SEL_1 and SEL_2 voltages) at the gate nodes 264/270 are utilized to select one of a plurality of different voltage conditions for assertion at the common body node 238. For the exemplary embodiment shown in FIG. 2, a low voltage condition (e.g., ground) will be established at the common body node 238 when SEL_1 is high and SEL_2 is high. This low voltage condition results because the PFET 260 will be off and the NFET 262 will be on when both SEL_1 and SEL_2 are high. For this low voltage condition, the threshold voltage of the NFETs 204/208 will be relatively high, resulting in relatively long evaluation times (compared to the other voltage conditions). In contrast, a high voltage condition (e.g., Vdd) will be established at the common body node 238 when SEL_1 is low and SEL_2 is low. This high voltage condition results because the PFET 260 will be on and the NFET 262 will be off when both SEL_1 and SEL_2 are low. For this high voltage condition, the threshold voltage of the NFETs 204/208 will be relatively low, resulting in relatively short evaluation times (compared to the other voltage conditions). The floating voltage condition will be established at the common body node 238 when SEL_1 is high and SEL_2 is low. This floating voltage condition results because both the PFET 260 and the NFET 262 will be off when SEL_1 is high and SEL_2 is low. For this floating voltage condition, the threshold voltage of the NFETs 204/208 will be at some intermediate voltage, resulting in relatively intermediate evaluation times (compared to the other voltage conditions). For this particular implementation, the state where SEL_1 is low and SEL_2 is high represents an illegal condition.

Depending upon the particular implementation and application, the sense amplifier system may employ a different topology for the voltage condition selector circuit. Indeed, the voltage condition selector circuit could be suitably configured to establish any number of different voltages at the common body node 238, and an embodiment of the sense amplifier system need not be limited or otherwise restricted to only a low voltage condition and a high voltage condition.

Sense Amplifier Operation

The sense amplifier circuit 200 functions to sense a small-swing differential voltage signal present at the first input node 240 and the second input node 242. For this example, one of the two input signals (either the true component or the complement component) will be substantially equal to Vdd, and the other input signal (either the complement component or the true component) will be at a voltage that is slightly less than Vdd. For typical small-swing differential input signals, the lower voltage component could be anywhere from about 50 mV to about $$\frac{Vdd}{2}$$

volts less than Vdd.

The basic operation of the sense amplifier circuit 200 follows well known principles. As mentioned above, the enable signal (which is present at the gate node 252 of the enable transistor 250) controls when the sense amplifier circuit 200 evaluates the differential input signal. Prior to assertion of the enable signal, the input transistors of the sense amplifier circuit 200 are pre-charged. The differential input signal is applied to the first input node 240 and the second input node 242 prior to assertion of the enable signal, which causes one of the two pre-charged voltages to drop by a small amount. Thereafter, the enable signal is asserted to detect the differential state of the sense amplifier circuit 200 (e.g., either a logic high state or a logic low state). In practice, the voltage at the common body node 238 needs to equalize back to its nominal voltage condition (as established by the voltage condition selector circuit 201) before the sense amplifier circuit 200 is enabled again to sense the differential input signal. The time required to equalize the common body node 238 will influence the maximum operating frequency (Fmax) of the sense amplifier circuit 200. Accordingly, shorter equalization times correspond to higher Fmax values, which are desirable in most practical applications. In addition, if the common body node 238 is maintained at a non-grounded voltage, then the transistor threshold voltage will be lower (relative to the threshold voltage corresponding to the grounded condition), resulting in quicker evaluation times. Shorter evaluation times also influence Fmax of the sense amplifier circuit 200, resulting in higher Fmax values.

Some conventional sense amplifier designs individually tie each of the two body nodes of the NFET transistors to ground. Although this technique is adequate for lower speed applications, it may not be suitable for higher speed applications, due to the time required to equalize the body nodes back to the nominal ground voltage, and due to a relatively high transistor threshold voltage (which results in longer evaluation times). Referring again to the sense amplifier circuit 200, it has been discovered that floating the common body node 238 or maintaining the common body node 238 at a high voltage (e.g., Vdd) results in a higher Fmax, because the voltage at the common body node 238 need not equalize to ground. Rather, the nominal voltage at the common body node 238 will be higher than zero volts DC and, therefore, the voltage at the common body node 238 can quickly settle to its nominal voltage. Moreover, when the common body node 238 is not grounded, the transistor threshold voltage is lowered, thus enabling quicker evaluation times. Consequently, connecting the two body nodes 234/236 together without asserting any voltage on the common body node 238 can result in improved performance (Fmax) in certain situations. In other scenarios, pulling the common body node 238 to a high reference voltage (such as Vdd) can result in a higher Fmax. Thus, one voltage condition at the common body node 238 might result in better sense amplifier performance than another voltage condition. Moreover, the particular voltage condition that results in the best performance metric for the sense amplifier circuit 200 may vary in a circuit-by-circuit manner, in a wafer-by-wafer manner, in a lot-by-lot manner, or the like. For this reason, the voltage condition selector circuit 201 can be utilized to test and evaluate the sense amplifier circuit for purposes of performance (speed) tuning and configuring.

Sense Amplifier Tuning And Configuring

Figure 3:
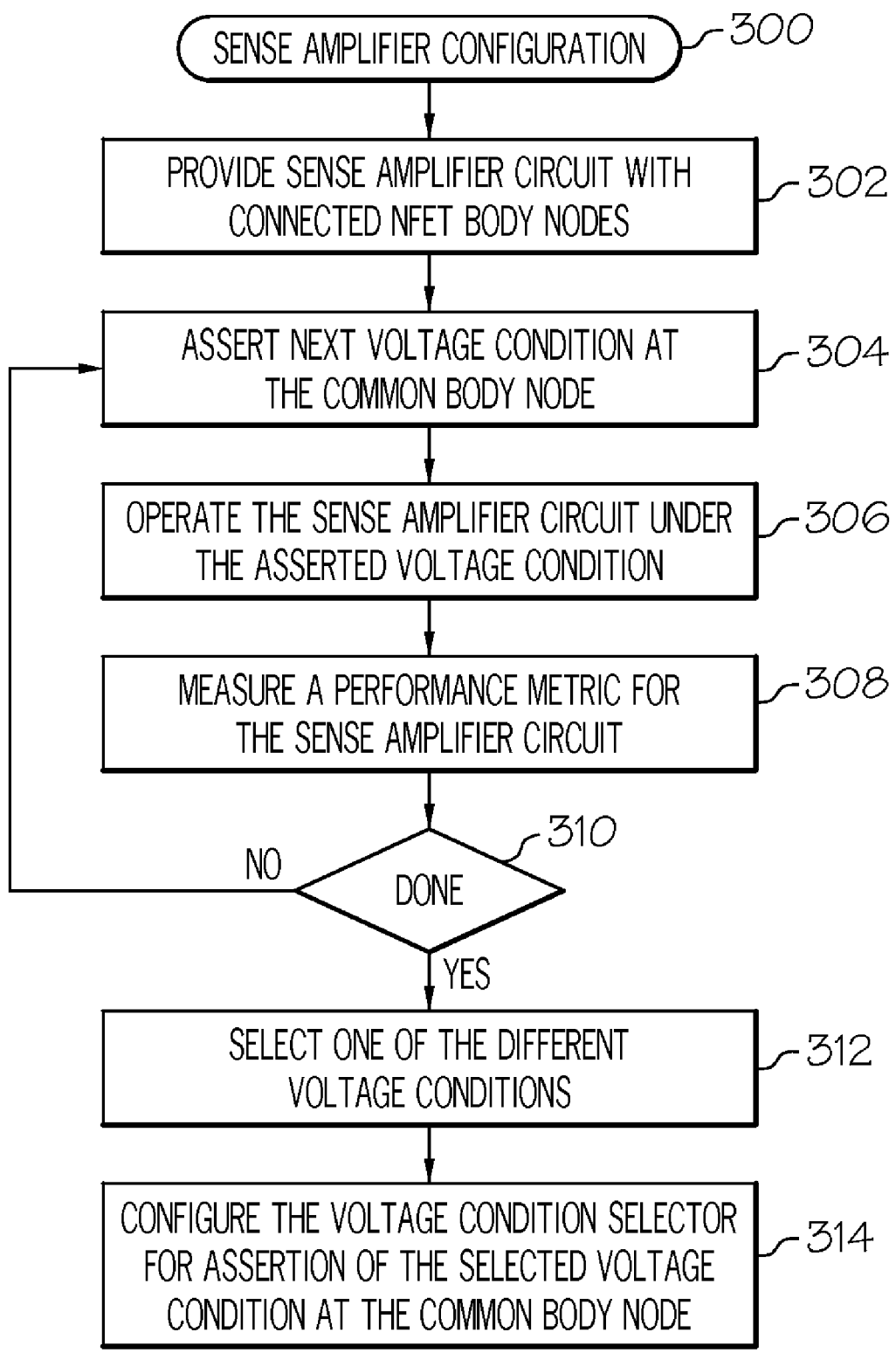
FIG. 3 is a flow chart that illustrates an embodiment of a sense amplifier configuration process.

FIG. 3 is a flow chart that illustrates an embodiment of a sense amplifier configuration process 300, which may be performed to evaluate, test, and configure the sense amplifier circuit 200. Some or all of the tasks performed in connection with the process 300 may be performed by software, hardware, firmware, or any combination thereof. For illustrative purposes, the following description of the process 300 may refer to elements mentioned above in connection with FIGS. 1 and 2. It should be appreciated that the process 300 may include any number of additional or alternative tasks, the tasks shown in FIG. 3 need not be performed in the illustrated order, and the process 300 may be incorporated into a more comprehensive procedure or process having additional functionality not described in detail herein. Moreover, an implementation of the process 300 could omit one or more of the illustrated tasks if such omission does not adversely affect the intended results.

The process 300 assumes that a suitable sense amplifier circuit or system has been provided for evaluation (task 302). For example, the sense amplifier system 100 (FIG. 1), the sense amplifier circuit 200 (FIG. 2), and/or the voltage condition selector circuit 201 (FIG. 2) could be provided here. The process 300 also assumes that the sense amplifier system has been set up and initialized in an appropriate manner for purposes of operational evaluation. For instance, the microprocessor or memory chip that embodies the sense amplifier system will be connected to the appropriate supply voltages (such as Vdd and DC ground), the sense amplifier system will be provided with an appropriate enable signal for the sense amplifier circuit (e.g., a clock signal), and a suitable differential input signal will be provided for testing purposes.

For this example, the sense amplifier circuit is evaluated under a plurality of different voltage conditions at the common body node 238 of the sense amplifier circuit 200. In this regard, an initial one of the different voltage conditions is asserted at the common body node 238 (task 304). As explained previously, the voltage condition selector circuit 201 can be manipulated (using the SEL_1 and SEL_2 signals) to select the desired voltage condition. For the exemplary embodiment described here, the initial voltage condition will be one of the following conditions: floating; high voltage; or low voltage. After asserting the initial voltage condition at the common body node 238, the process 300 continues by operating the sense amplifier circuit 200 under the asserted voltage condition (task 306). The sense amplifier circuit 200 is operated to obtain test results corresponding to the asserted voltage condition. In this regard, the process 300 can measure one or more performance metrics (task 308) for the sense amplifier circuit 200 while operating the sense amplifier circuit 200. In practice, the measured performance metric may be, without limitation: a maximum operating frequency (Fmax) of the sense amplifier circuit 200; a power consumption measure; an electrical current measure; or the like. Ultimately, the test results might indicate the performance metric(s) for each of the different voltage conditions.

If the process 300 has evaluated all of the desired voltage conditions (query task 310), then it can continue to task 312. If not, then task 304 is re-entered to assert the next voltage condition at the common body node 238. This iterative loop enables the process 300 to evaluate each of the different voltage conditions, while collecting the test results corresponding to each voltage condition. If all of the testing iterations have been completed (query task 310), then the process 300 can select one of the different voltage conditions (task 312). Notably, the selected voltage condition will be influenced or determined by the test results gathered during the process 300. For this particular example, the voltage condition that produces the highest Fmax is selected during task 312.

After the desired voltage condition has been identified, the process 300 can configure the voltage condition selector circuit 201 (task 314) in an appropriate manner such that it will assert the selected voltage condition at the common body node 238 during operation of the sense amplifier system. In this regard, task 314 may be executed by fixing the voltage condition selector circuit 201 in a state that provides the selected voltage condition. For example, the fusing arrangement 106 (FIG. 1) could be burned or otherwise fixed to provide the desired voltages for SEL_1 and SEL_2 (see FIG. 2), which in turn establish the selected voltage condition at the common body node 238. In certain embodiments, the state of the fusing arrangement 106 and/or the states of SEL_1 and SEL_2 could be set using one or more control bits, such as one or more Joint Test Action Group (JTAG) bits. After selecting and configuring the sense amplifier system in this manner, the device or chip that hosts the sense amplifier system can be released in this fixed state.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An electronic circuit comprising:
a first transistor having a first source node, a first gate node, and a first drain node;
a second transistor having a second source node, a second gate node, and a second drain node;
a third transistor having a third source node, a third gate node, a third drain node, and a third body node; and
a fourth transistor having a fourth source node, a fourth gate node, a fourth drain node, and a fourth body node; wherein:
the first gate node is electrically coupled to the third gate node, to the second drain node, and to the fourth drain node;
the second gate node is electrically coupled to the fourth gate node, to the first drain node, and to the third drain node;
the third source node is electrically coupled to the fourth source node, forming a common source node for the electronic circuit; and
the third body node is directly connected to the fourth body node.

2. The electronic circuit of claim 1, wherein:
the first transistor is a p-type field effect transistor (PFET);
the second transistor is a PFET;
the third transistor is an n-type field effect transistor (NFET); and
the fourth transistor is an NFET.

3. The electronic circuit of claim 1, further comprising a fifth transistor having a fifth source node, a fifth gate node, and a fifth drain node, wherein the fifth drain node is electrically coupled to the third source node and to the fourth source node.

4. The electronic circuit of claim 3, wherein the fifth source node is electrically coupled to a low reference voltage.

5. The electronic circuit of claim 1, further comprising a voltage condition selector electrically coupled to the third body node and to the fourth body node, the voltage condition selector being configured to assert one of a plurality of voltage conditions at the third body node and the fourth body node.

6. The electronic circuit of claim 5, the voltage condition selector comprising:
a sixth transistor having a sixth source node, a sixth gate node, and a sixth drain node; and
a seventh transistor having a seventh source node, a seventh gate node, and a seventh drain node; wherein:
the sixth source node is electrically coupled to a high reference voltage;
the sixth drain node is electrically coupled to the seventh drain node, to the third body node, and to the fourth body node;
the seventh source node is electrically coupled to a low reference voltage; and
voltages at the sixth gate node and the seventh gate node select the one of a plurality of voltage conditions for assertion at the third body node and the fourth body node.

7. The electronic circuit of claim 5, wherein the plurality of voltage conditions includes a low voltage condition, a high voltage condition, and a floating voltage condition.

8. The electronic circuit of claim 1, wherein the third body node and the fourth body node correspond to a high reference voltage.

9. The electronic circuit of claim 1, wherein the third body node and the fourth body node correspond to a floating voltage node.

10. A sense amplifier circuit comprising:
a first transistor arrangement comprising a first n-type field effect transistor (NFET) having a respective body node;
a second transistor arrangement comprising a second NFET having a respective body node, the second transistor arrangement electrically coupled to the first transistor arrangement, and the body node of the first NFET directly connected to the body node of the second NFET; and a voltage condition selector electrically coupled to the body node of the first NFET and to the body node of the second NFET, the voltage condition selector configured to assert one of a plurality of voltage conditions at the body node of the first NFET and at the body node of the second NFET.

11. The sense amplifier circuit of claim 10, wherein:
the first transistor arrangement further comprises a first p-type field effect transistor (PFET) having respective source, gate, and drain nodes;
the second transistor arrangement further comprises a second PFET having respective source, gate, and drain nodes;
the first NFET has respective source and drain nodes;
the second NFET has respective source and drain nodes;
the gate node of the first PFET is electrically coupled to the gate node of the first NFET, to the drain node of the second PFET, and to the drain node of the second NFET; and
the gate node of the second PFET is electrically coupled to the gate node of the second NFET, to the drain node of the first PFET, and to the drain node of the first NFET.

12. The sense amplifier circuit of claim 11, wherein the source node of the first NFET is electrically coupled to the source node of the second NFET.

13. The sense amplifier circuit of claim 12, further comprising an enable transistor coupled to the source node of the first NFET and to the source node of the second NFET, the enable transistor being configured to enable a sense operation of the sense amplifier circuit.

14. The sense amplifier circuit of claim 10, wherein the plurality of voltage conditions includes a low voltage condition, a high voltage condition, and a floating voltage condition.

15. The sense amplifier circuit of claim 10, wherein:
the first transistor arrangement comprises a first input node for receiving a true component of an input signal; and
the second transistor arrangement comprises a second input node for receiving a complement component of the input signal.

16. The sense amplifier circuit of claim 10, the voltage condition selector comprising:
a p-type field effect transistor (PFET) having respective source, gate, and drain nodes; and
a third NFET having respective source, gate, and drain nodes; wherein:
the source node of the PFET is electrically coupled to a high reference voltage;
the drain node of the PFET is electrically coupled to the drain node of the third NFET, to the body node of the first NFET, and to the body node of the second NFET;
the source node of the third NFET is electrically coupled to a low reference voltage; and
voltages at the gate node of the PFET and at the gate node of the third NFET are operative to select the one of a plurality of voltage conditions for assertion at the body node of the first NFET and at the body node of the second NFET.

17. The sense amplifier circuit of claim 16, further comprising a fusing arrangement for the voltage condition selector, the fusing arrangement being configured to fix the voltages at the gate node of the PFET and at the gate node of the third NFET.

18. A method of configuring and operating a sense amplifier circuit, the method comprising:
providing the sense amplifier circuit with a first p-type field effect transistor (PFET), a first n-type field effect transistor (NFET) electrically coupled to the first PFET, a second PFET, and a second NFET coupled to the second PFET, wherein the first NFET has a first body node, the second NFET has a second body node, and the first body node is directly connected to the second body node;
asserting a plurality of different voltage conditions at the first body node and at the second body node;
operating the sense amplifier circuit under each of the different voltage conditions to obtain test results corresponding to each of the different voltage conditions;
selecting one of the different voltage conditions to obtain a selected voltage condition, wherein the selected voltage condition is influenced by the test results; and
configuring a voltage condition selector of the sense amplifier circuit for assertion of the selected voltage condition at the first body node and at the second body node.

19. The method of claim 18, wherein asserting the plurality of different voltage conditions asserts a low voltage condition, a high voltage condition, and a floating voltage condition.

20. The method of claim 18, further comprising measuring a performance metric for the sense amplifier circuit while operating the sense amplifier circuit, wherein the test results indicate the performance metric for each of the different voltage conditions.

21. The method of claim 20, wherein measuring the performance metric comprises measuring a maximum operating frequency of the sense amplifier circuit.

22. The method of claim 18, wherein configuring the voltage condition selector comprises fixing the voltage condition selector in a state that provides the selected voltage condition.

23. An electronic circuit comprising:
a first transistor having a first source node, a first gate node, and a first drain node;
a second transistor having a second source node, a second gate node, and a second drain node;
a third transistor having a third source node, a third gate node, a third drain node, and a third body node;
a fourth transistor having a fourth source node, a fourth gate node, a fourth drain node, and a fourth body node;
a voltage condition selector electrically coupled to the third body node and to the fourth body node, the voltage condition selector being configured to assert one of a plurality of voltage conditions at the third body node and the fourth body node, the voltage condition selector comprising:
a sixth transistor having a sixth source node, a sixth gate node, and a sixth drain node; and
a seventh transistor having a seventh source node, a seventh gate node, and a seventh drain node; wherein:
the sixth source node is electrically coupled to a high reference voltage;
the sixth drain node is electrically coupled to the seventh drain node, to the third body node, and to the fourth body node;
the seventh source node is electrically coupled to a low reference voltage; and
voltages at the sixth gate node and the seventh gate node select the one of a plurality of voltage conditions for assertion at the third body node and the fourth body node; wherein:

the first gate node is electrically coupled to the third gate node, to the second drain node, and to the fourth drain node;

the second gate node is electrically coupled to the fourth gate node, to the first drain node, and to the third drain node;

the third source node is electrically coupled to the fourth source node; and the third body node is electrically coupled to the fourth body node.

24. A sense amplifier circuit comprising:

a first transistor arrangement comprising a first n-type field effect transistor (NFET) having a respective body node;

a second transistor arrangement comprising a second NFET having a respective body node, the second transistor arrangement electrically coupled to the first transistor arrangement, and the body node of the first NFET electrically coupled to the body node of the second NFET; and a voltage condition selector electrically coupled to the body node of the first NFET and to the body node of the second NFET, the voltage condition selector configured to assert one of a plurality of voltage conditions at the body node of the first NFET and at the body node of the second NFET, the voltage condition selector comprising:

a p-type field effect transistor (PFET) having respective source, gate, and drain nodes; and a third NFET having respective source, gate, and drain nodes; wherein:

the source node of the PFET is electrically coupled to a high reference voltage;

the drain node of the PFET is electrically coupled to the drain node of the third NFET, to the body node of the first NFET, and to the body node of the second NFET;

the source node of the third NFET is electrically coupled to a low reference voltage; and voltages at the gate node of the PFET and at the gate node of the third NFET are operative to select the one of a plurality of voltage conditions for assertion at the body node of the first NFET and at the body node of the second NFET.

* * * * *